(12) United States Patent
Jeong et al.

(10) Patent No.: US 7,703,198 B2
(45) Date of Patent: Apr. 27, 2010

(54) METHOD OF MANUFACTURING CAPACITOR-EMBEDDED LOW TEMPERATURE CO-FIRED CERAMIC SUBSTRATE

(75) Inventors: Seung Gyo Jeong, Gyunggi-do (KR);
Yong Seok Choi, Gyunggi-do (KR); Ki Pyo Hong, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 47 days.

(21) Appl. No.: 11/819,897

(22) Filed: Jun. 29, 2007

(65) Prior Publication Data
US 2008/0000061 A1     Jan. 3, 2008

(30) Foreign Application Priority Data
Jun. 30, 2006   (KR)   ............... 10-2006-0060706

(51) Int. Cl.
*H05K 3/30* (2006.01)
*H01G 4/06* (2006.01)

(52) U.S. Cl. ............... 29/832; 29/825; 29/846; 29/852; 29/25.03; 29/25.42; 361/321.2; 361/311; 361/305

(58) Field of Classification Search ............ 29/29, 29/25.35–25.42, 25.01–25.03, 830, 832, 29/846–847, 852; 361/321.2–321.3, 311, 361/303, 301.1, 760, 765, 795; 438/361, 438/393, 957; 156/89.12
See application file for complete search history.

(56) References Cited

U.S. PATENT DOCUMENTS

| 5,661,882 | A  | * | 9/1997 | Alexander | 29/25.42 |
| 6,228,196 | B1 | * | 5/2001 | Sakamoto et al. | 156/89.17 |
| 6,241,838 | B1 | * | 6/2001 | Sakamoto et al. | 156/89.17 |
| 6,252,761 | B1 | * | 6/2001 | Branchevsky | 361/321.2 |
| 6,446,317 | B1 | * | 9/2002 | Figueroa et al. | 29/25.42 |
| 6,470,545 | B1 | * | 10/2002 | Branchevsky | 29/25.42 |
| 6,694,583 | B2 | * | 2/2004 | Branchevsky | 29/25.42 |
| 6,967,138 | B2 | * | 11/2005 | Ding | 438/253 |
| 7,378,326 | B2 | * | 5/2008 | Ahn et al. | 438/361 |
| 2002/0026978 | A1 | | 3/2002 | Harada et al. | |

FOREIGN PATENT DOCUMENTS

| JP | 2002-084067 | 3/2002 |
| KR | 2000-0045202 | 7/2000 |

OTHER PUBLICATIONS

Japanese Office Action issued in Japanese Patent Application No. JP 2007-172599, dated Jul. 21, 2009.

* cited by examiner

*Primary Examiner*—Minh Trinh
(74) *Attorney, Agent, or Firm*—McDermott Will & Emery LLP

(57) ABSTRACT

A method of manufacturing a capacitor-embedded low temperature co-fired ceramic substrate. A capacitor part is manufactured by firing a deposition including at least one high dielectric ceramic sheet to form a capacitor part. A plurality of low temperature co-fired green sheets are provided. Each of the low temperature co-fired green sheet has at least one of a conductive pattern and a conductive via hole thereon. A low temperature co-fired ceramic deposition is formed by depositing the low temperature co-fired green sheets to embed the capacitor part in the low temperature co-fired ceramic deposition. The embedded capacitor part is connected either to the conductive pattern or the conductive via hole of an adjacent green sheet. Then the low temperature co-fired ceramic deposition having the capacitor part embedded therein is fired.

21 Claims, 6 Drawing Sheets

METHOD OF MANUFACTURING CAPACITOR-EMBEDDED LOW TEMPERATURE CO-FIRED CERAMIC SUBSTRATE

CROSS-REFERENCE TO RELATED APPLICATIONS

This application claims the priority of Korean Patent Application No. 2006-60706 filed on Jun. 30, 2006, in the Korean Intellectual Property Office, the disclosure of which is incorporated herein by reference.

BACKGROUND OF THE INVENTION

1. Field of the Invention

The present invention relates to a method of manufacturing a low temperature co-fired ceramic (LTCC) substrate, and more particularly, to a method of manufacturing a capacitor-embedded LTCC substrate, capable of being employed as a package substrate for modules of electronic products.

2. Description of the Related Art

Recently, a more compact and higher frequency trend of various electronic products has increased a call for smaller size, lighter weight and multi-functionality of the parts embedded therein. Meanwhile, electronic products are required to possess a high-power capacitor for decoupling to protect themselves from noises caused by division of electric power among each functional module. This increases the number of conventional surface-mounted capacitors, thereby increasing the size or height of a substrate or module.

FIG. 1 is a cross-sectional view illustrating a high frequency module structure employing a conventional LTCC substrate which has drawn attention due to low-loss high-frequency characteristics.

Referring to FIG. 1, a high frequency module 10 includes an LTCC substrate 11 formed of a plurality of LTCC layers 11a to 11e, and a passive device such as an IC chip 16 and a capacitor 15 mounted on the substrate 11. The LTCC layers 11a to 11e each are provided with a conductive pattern 12 and a conductive via hole 13 to serve as a desired circuit.

As described above, the capacitor 15 needs to be bigger-sized in line with the recent trend of products, thereby rendering it hard to reduce the size of the module itself.

To overcome this problem, studies have been vigorously conducted to develop a method of embedding a passive device such as a capacitor in a substrate such as a printed circuit board (PCB). However, in the LTCC substrate shown in FIG. 1, a high dielectric material for a high-power capacitor has a firing shrinkage rate considerably different from a low-temperature co-fired ceramic. This poses a practical difficulty to the manufacture of the capacitor-embedded LTCC substrate.

Of course, in some of surface mount device (SMD) components, sheets with a low dielectric constant and sheets with an intermediate dielectric constant of typically up to 100 are co-fired to manufacture small parts such as a bandpass filter and a balance filter. However, in a relatively big LTCC substrate used in the module, a heterogeneous dielectric material has been rarely adopted. As described above, studies have been carried out only on co-firing of the material with an intermediate dielectric constant and the material with a low dielectric constant.

As a result, a high-power capacitor having a capacitance of 100 pF to several nF has the SMD components surface-mounted thereon.

SUMMARY OF THE INVENTION

An aspect of the present invention provides a method of manufacturing a low temperature co-fired ceramic (LTCC) substrate having a high-power capacitor formed of a high dielectric ceramic requiring high temperature co-firing, embedded in an LTCC substrate, thereby mechanically stable and suitable for high frequency conditions.

According to an aspect of the present invention, there is provided a method of manufacturing a capacitor-embedded LTCC substrate, the method including manufacturing a capacitor part by firing a deposition including at least one high dielectric ceramic sheet to form a capacitor part; providing a plurality of low temperature co-fired green sheets each having at least one of a conductive pattern and a conductive via hole thereon; forming an LTCC deposition by depositing the low temperature co-fired green sheets to embed the capacitor part in the LTCC deposition, the embedded capacitor part connected to the one of conductive pattern and conductive via hole of an adjacent one of the green sheets; and firing the LTCC deposition having the capacitor part embedded therein.

A dielectric constant of a material forming the high dielectric ceramic sheet of the capacitor part may be greater than 1000. However, the LTCC substrate obtained is free from deformation or cracks even though the high dielectric material may contract when fired. Each layer of the LTCC substrate is formed of $Al_2O_3$.

The high dielectric ceramic sheet of the capacitor part may be fired at a temperature of about 1000 to 1400□, and the LTCC deposition may be fired at a temperature of about 900 to 1100□.

The capacitor part may be at least one deposited capacitor block including a plurality of dielectric layers and first and second internal electrodes formed on top and bottom surfaces of the dielectric layers, respectively, and the forming the LTCC deposition includes punching some of the low temperature co-fired green sheets to form at least one cavity inside the LTCC deposition; depositing the low temperature co-fired green sheets; and mounting the deposited capacitor block on the cavity in the depositing process.

The cavity may have a depth greater than a depth of the deposited capacitor block mounted thereon, considering a contraction degree of the low temperature co-fired green sheets during the firing.

The forming the LTCC deposition may include compressing a confinement layer onto at least one of a top surface and a bottom surface of the LTCC deposition to prevent contraction of the LTCC deposition, the method further including removing the confinement layer from the LTCC substrate after the firing the LTCC deposition.

The confinement layer provided to both surfaces of the LTCC deposition more effectively restrains the LTCC deposition from contracting in a planar direction.

The confinement layer may be formed of a mixture of fired ceramic and glass. Here, during firing, the glass in the confinement layer is absorbed in a low temperature co-firing ceramic to remain as powder. Therefore, the confinement layer may be easily removed.

The forming the LTCC deposition may include interposing an internal confinement layer between a corresponding one of the green sheets providing an opening of the cavity and the green sheet adjacent above thereto. In this case, considering sufficient effects of preventing contraction and convenience in designing, the internal confinement layer may have a thickness ranging from about 3 to 20 µm. The internal confinement layer may include a fired ceramic layer and glass layers formed on both surfaces of thereof. Here, the glass is absorbed in an adjacent one of the LTCC layers to allow only the ceramic layers to be solidly bonded to an adjacent one thereof.

The capacitor part may be at least one capacitor layer including a ferroelectric layer having a size approximately identical to a size of the LTCC substrate and the first and second electrodes formed on at least a portion of one of a top surface and a bottom surface of the ferroelectric layer, and the forming the LTCC deposition includes depositing the low temperature co-fired green sheets together with the capacitor layer.

The forming the LTCC deposition may include compressing a confinement layer onto at least one of a top surface and a bottom surface of the LTCC deposition to prevent contraction of the low temperature co-fired green sheets, the method further including removing the confinement layer from the LTCC substrate after the firing the LTCC deposition. Here, the confinement layer is provided on both surfaces of the LTCC deposition.

Alternatively, the capacitor layer is disposed adjacent to one of the top surface and bottom surface of the LTCC deposition and the confinement layer is provided on another corresponding one of the top surface and bottom surface of the LTCC deposition. This is because the capacitor layer itself prevents the LTCC deposition from contracting in a planar direction in a similar manner to the confinement layer.

The capacitor layer may further include a conductive via hole extending through a portion of the ferroelectric layer where the first and second electrodes are not formed, to connect one of the conductive pattern and conductive via hole of the green sheets disposed on a top and a bottom of the capacitor layer, respectively, to each other. The capacitor layer may have a low dielectric area for surrounding the conductive via hole in the dielectric layer, the low dielectric area formed of a material having a dielectric constant lower than other areas of the capacitor layer. This reduces parasitic inductance caused by the via hole. Here, the low dielectric area is formed of a material identical to the LTCC material forming the LTCC substrate.

The forming the LTCC deposition may include depositing the plurality of low temperature co-fired green sheets to interpose a binder layer between the capacitor layer and an adjacent one of the low temperature co-fired green sheets, thereby increasing binding strength therebetween.

The binder layer is formed of a thermoplastic polymer material removable during firing of the LTCC deposition. Here, the forming the LTCC deposition may include heat-treating the binder layer interposed between the capacitor layer and the adjacent cold temperature co-fired green sheet at a temperature of 60 to 100□ to activate the thermoplastic polymer material.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
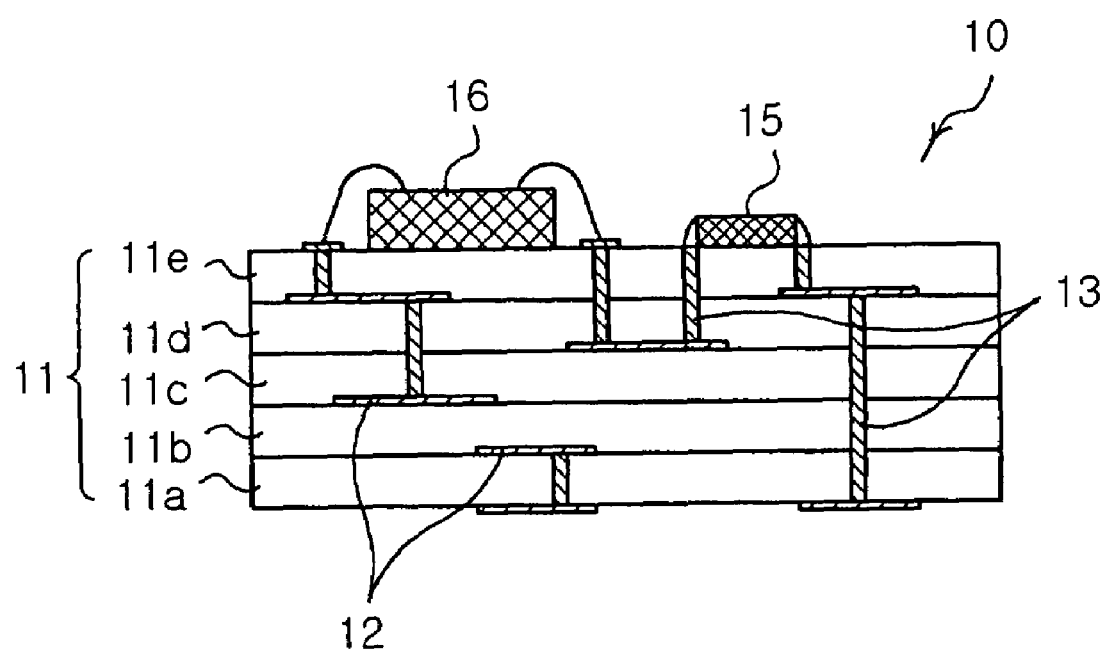
FIG. 1 is a cross-sectional view illustrating a conventional LTCC substrate module.
Figure 2:
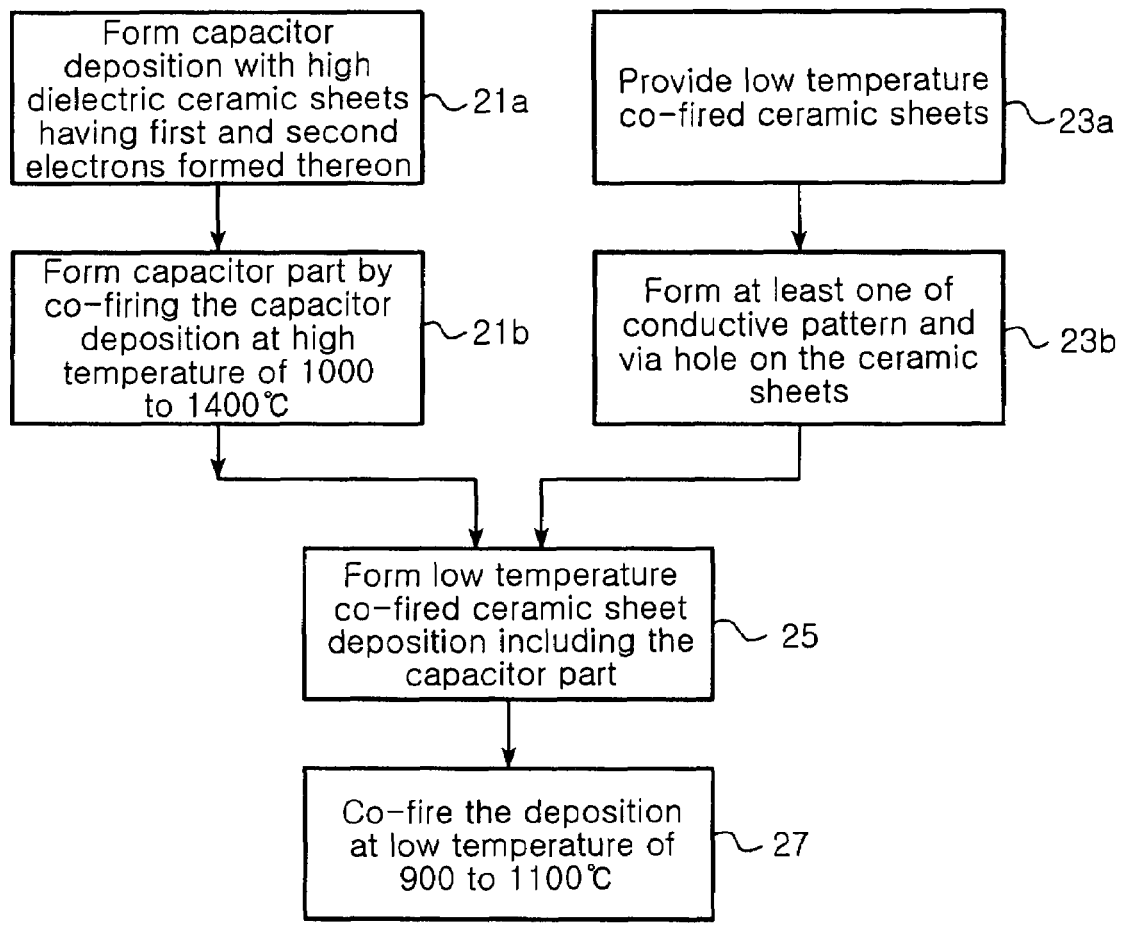
FIG. 2 is a flow chart for explaining a method of manufacturing a capacitor-embedded LTCC substrate according to an exemplary embodiment of the invention.

FIG. 2 is a flow chart illustrating a method of manufacturing a capacitor-embedded low temperature co-fired ceramic (LTCC) substrate according to an exemplary embodiment of the invention.

As shown in FIG. 2, in manufacturing the capacitor-embedded LTCC substrate, a capacitor part is manufactured before a low temperature co-fired ceramic (LTCC) substrate is fired.

First, as shown in 21a, a capacitor deposition is formed of a plurality of high dielectric ceramic sheets each having first and second electrodes disposed thereon. The capacitor deposition may be variously configured according to a desired capacitor structure. For example, the capacitor deposition may be a deposited capacitor block having a plurality of high dielectric ceramic sheets and first and second internal electrodes disposed on both surfaces of the ceramic sheets, respectively. On the other hand, the capacitor deposition may be a layer capacitor structure having a capacitor area defined by a single high dielectric ceramic sheet and first and second electrodes disposed on one of a top surface and a bottom surface of the ceramic sheet. The capacitor part may be formed of a single capacitor but may be configured as an array capacitor having a plurality of capacitors arranged therein.

A high dielectric material for this high dielectric ceramic sheet may be a ferroelectric material having a dielectric constant of at least about 1000, particularly, 2000 to 3000. A representative example of the high dielectric material includes $BaTiO_3$.

Subsequently, according to the present embodiment, before being deposited together with the LTCC sheets, the capacitor deposition is fired at a high temperature to manufacture the capacitor part (operation 21b). The high dielectric ceramic sheet adopting a general high dielectric material is fired at a temperature of about 1000 to 1400° C. The capacitor part may be manufactured in a similar manner to a conventional capacitor fabrication method, however without entailing additional plating in forming external terminals. This is because a low temperature co-fired electrode material is employed to solidly connect the external terminals of the capacitor part with one of conductive patterns and conductive via holes of the LTCC sheets in a later process.

Apart from this fabrication of the capacitor, in operation 23a, a plurality of LTCC sheets are provided. The LTCC sheets may be formed of various known materials such as a mixture of $Al_2O_3$ and glass. Then, in operation 23b, the conductive patterns and conductive via holes are formed on the ceramic sheets to serve as a necessary circuit between layers. The conductive patterns may be formed by a known art such as screen printing. The conductive via holes may be formed by punching and then by printing for filling conductive materials.

In operation 25, the capacitor part manufactured previously and the LTCC sheets provided as above are deposited to form a deposition. In this process, the capacitor part may be deposited or mounted by a proper embedding method according to a structure thereof, which will be described later. Also, in the depositing process, external electrodes of the capacitor part are connected to one of the conductive patterns and conductive via holes of the LTCC sheets, respectively. Here, as described above, a low temperature co-fired electrode paste formed of such as Ag, Cu, and alloys thereof is added to a connecting portion between the external electrodes of the capacitor part and the conductive patterns (conductive via holes), thereby ensuring secure electrical connection therebetween.

Next, in operation 27, the LTCC deposition is fired at a low temperature to manufacture a capacitor-embedded LTCC substrate. The low temperature firing may be carried out at a temperature of about 900 to 1100□. In this low temperature co-firing, the capacitor part, which has been already fired, does not experience contraction. Rather, the capacitor part formed of a pre-fired material restrains the LTCC deposition from contracting, notably in a planar direction.

Optionally, the LTCC substrate obtained may have a bonding pad formed thereon by plating an exposed portion of the conductive patterns with an alloy such as Ni/Au or Ni/Sn. This allows semiconductor parts to be mounted on the LTCC substrate.

As described above, according to the present embodiment, a high dielectric material for the capacitor part may adopt a ferroelectric material having a dielectric constant greater than 1000, but still provides the LTCC substrate free from deformation or cracks despite contraction thereof during the firing.

Figure 3:
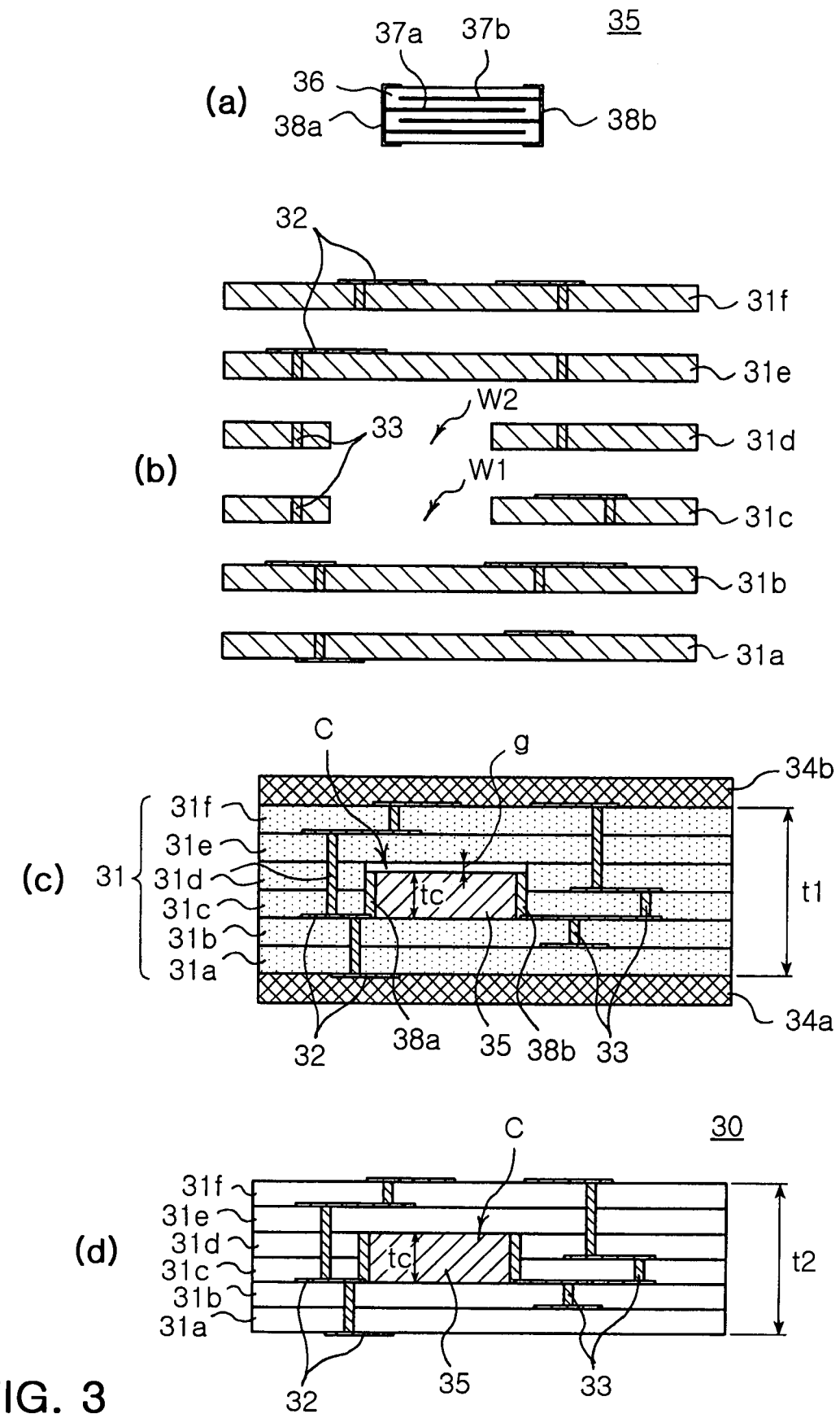
FIG. 3 is a cross-sectional view illustrating a method of manufacturing a capacitor-embedded LTCC substrate according to an exemplary embodiment of the invention.
Figure 5:
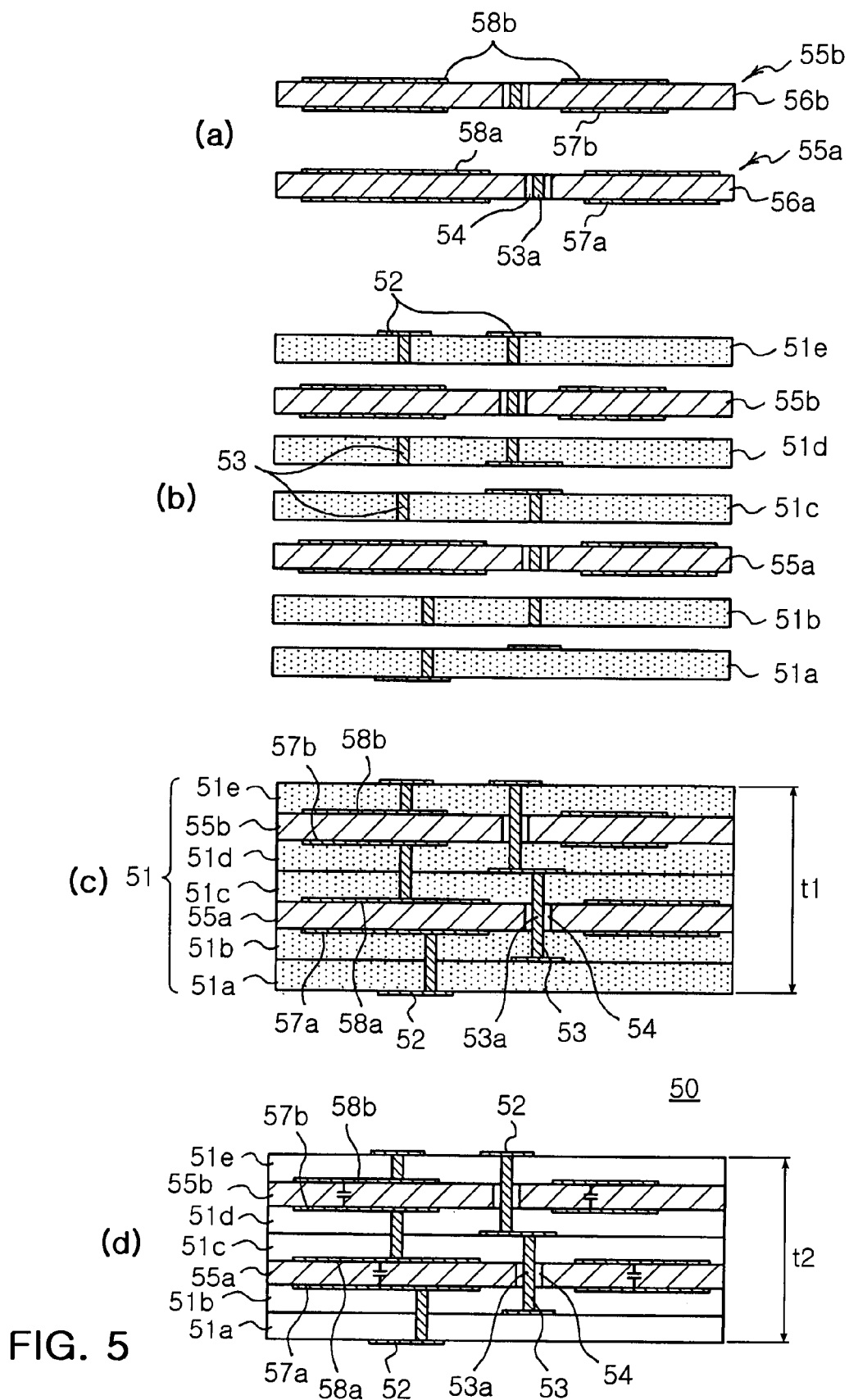
FIG. 5 is a cross-sectional view illustrating a method of manufacturing a capacitor-embedded LTCC substrate according to an exemplary embodiment of the invention.

The present embodiment is beneficially applicable to various types of capacitors such as a deposited chip capacitor structure or a capacitor layer structure. Also, each embodiment provides an additional advantage. FIGS. 3 and 5 illustrate exemplary embodiments in which different embedded capacitors are employed, respectively.

FIGS. 3A to 3D are cross-sectional views for explaining a method of manufacturing an LTCC substrate in which an embedded capacitor is configured as a deposited chip capacitor according to an exemplary embodiment of the invention.

As shown in FIG. 3A, a deposition 36 including at least one high dielectric ceramic sheet is fired to manufacture a capacitor part 35.

The capacitor part 35 according to the present embodiment is at least one deposited chip capacitor 35 including a plurality of dielectric layers and first and second internal electrodes 37a and 37b formed on top and bottom surfaces of the dielectric layers, respectively. The capacitor part also includes external terminals connected to the internal electrodes 37a and 37b, respectively.

Of course, the deposited chip capacitor 35 is not limited to a structure of FIG. 3A. The deposited chip capacitor part 35 may be configured as one of an array having a plurality of capacitors arranged and a structure in which the external terminals are formed on top and bottom surfaces by the conductive via holes. In this fashion, the capacitor part 35 is manufactured primarily by high temperature firing.

Then as shown in FIG. 3B, a plurality of low-temperature green sheets 31a to 31f having at least one of conductive patterns 32 and conductive via holes 33 thereon are provided. The low-temperature co-fired green sheets 31a to 31f may be formed of an appropriate mixture of $Al_2O_3$ and glass.

The conductive patterns 32 and the conductive via holes 33 are formed on the low-temperature co-fired green sheets 31a to 31f to serve as a necessary inter-layer circuit. The conductive patterns 32 and the conductive via holes 33 are formed of a low temperature co-fired electrode material such as Ag, Cu and alloys thereof. This process can be conducted by a known art such as printing and punching.

Moreover, to secure a space for embedding the deposited chip capacitor part 35, the low temperature co-fired green sheets 31d and 31c to be deposited in an inner periphery of the deposition 36 is punched in a certain area to form windows W1 and W2.

Subsequently, as shown in FIG. 3C, the plurality of low-temperature firing green sheets 31a to 31f are deposited to embed the deposited chip capacitor part 35 therein, thereby forming an LTCC deposition 31.

In this process, the deposited chip capacitor 35 is mounted in a cavity C defined by the windows W1 and W2 previously formed. During this mounting, the external terminals of the deposited chip capacitor 35 are connected to the conductive pattern 32 of the specific sheet 31b to connect to the inter-layer circuit. Here, the low temperature firing electrode material (not shown) such as Ag, Cu and alloys thereof may be employed to assure solid bonding between the external terminals 38a and 38b of the deposited chip capacitor 35 and the conductive pattern 32.

Preferably, the cavity C is formed to a depth greater than a depth tc of a deposited capacitor block 35 to occupy a certain extra space g. The cavity C has a dimension measured in adequate consideration of a contraction degree of the low-temperature co-fired green sheets, i.e., a material for the low temperature co-fired ceramic sheets and thickness of the layers.

Furthermore, in this process, confinement layers 34a and 34b are compressed onto top and bottom surfaces of the LTCC deposition 31. Of course, the confinement layers 34a and 34b may be provided on a surface of the deposition 31, but particularly on both surfaces thereof to more effectively prevent the LTCC deposition 31 from contracting in a planar direction and undergoing deformation. The confinement layers 34a and 34b may be formed of a mixture of a high temperature sintered ceramic power such as $Al_2O_3$ and glass.

Finally, the LTCC deposition 31 is fired and then the confinement layers 34a and 34b and residue thereof are removed from the LTCC substrate 30, thereby producing an embedded LTCC substrate 30 as shown in FIG. 3D.

This process may be performed at a typical low temperature firing temperature of 900 to 1100□. In the firing process, the LTCC deposition 31 is effectively restrained from shrinking in a planar direction, thus free from cracks and deformation. Meanwhile, the LTCC deposition 31 is significantly reduced in its thickness from t1 to t2. Despite this reduction in the thickness of the LTCC deposition 31, the pre-fired deposited chip capacitor 35 maintains approximately uniform thickness tc. Thus, it is structurally robust to provide an extra space to the cavity, as shown in FIG. 3C.

In a case where the confinement layers 34a and 34b are formed of a mixture of the pre-fired ceramic power and glass, after the firing, most of the glass is absorbed in adjacent ones of the low temperature co-fired ceramic substrates 31a and 31f to remain only as ceramic power and thereby easily removed.

In the present embodiment, a single capacitor 35 is mounted in a single cavity C. Alternatively, it will be readily understood that a plurality of cavities may be formed to embed a plurality of capacitors therein.

Figure 4:
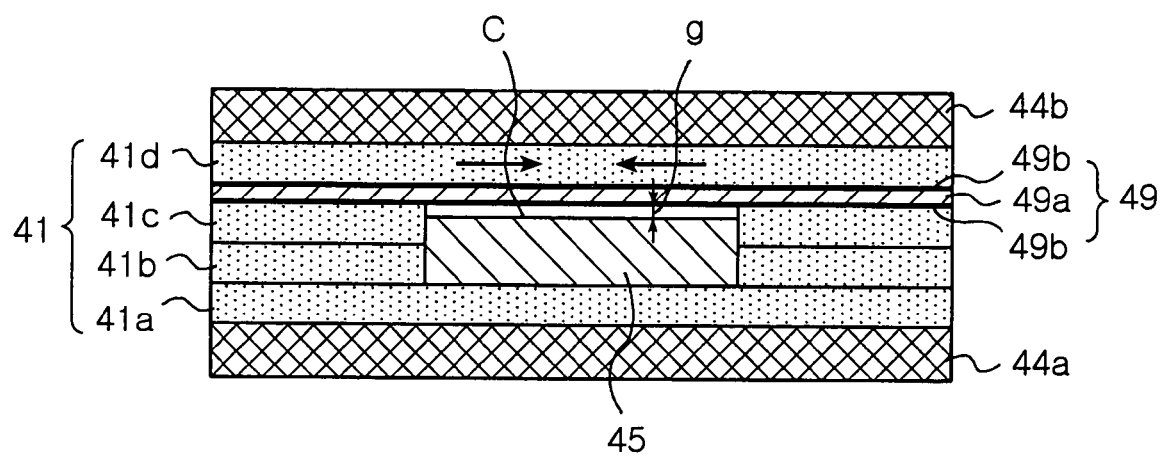
FIG. 4 is a cross-sectional view illustrating a method of manufacturing a capacitor-embedded LTCC substrate using an internal confinement layer according to an exemplary embodiment of the invention.

FIG. 4 is a cross-sectional view illustrating a method of manufacturing a capacitor-embedded LTCC substrate employing an internal confinement layer. FIG. 4 is construed to be similar to a structure shown in FIG. 3C even though in this drawing, conductive patterns and via holes formed on green sheets are omitted in regard to formation of an LTCC deposition.

As shown in FIG. 4, in forming the LTCC deposition 41, confinement layers 44a and 44b are compressed onto top and bottom surfaces of the deposition 41 and an internal confinement layer 49 is interposed between a corresponding one of the green sheets providing an opening of the cavity C and the green sheet 41d adjacent above thereto.

The internal confinement layer 49 can effectively restrain the LTCC deposition 41 from shrinking locally (as indicated with an arrow) in a cavity C for a capacitor 45.

Also, the internal confinement layer 49 is interposed between layers to constitute the deposition 41 and thus required to remain structurally a part of the layer structure even after firing. As shown in FIG. 4, the internal confinement layer 49 includes a pre-fired ceramic layer 49a and glass layers 49b formed on both surfaces thereof. The ceramic layer 49a may be formed of a material identical to a post-fired substrate 41.

In this case, the glass layer 49a is absorbed in adjacent ones of the low temperature co-fired sheets 41c and 41d, leaving only the ceramic layer 49b. Thus, the ceramic layer 49b remains as a part of the LTCC substrate along with an adjacent ceramic layer. The internal confinement layer 49 may have a thickness of about at least 3 µm to sufficiently suppress contraction of the LTCC substrate and about at least 20 µm to ensure a thinner substrate.

FIG. 5 is a cross-sectional view illustrating a method of manufacturing a capacitor-embedded LTCC substrate according to an exemplary embodiment of the invention.

As shown in FIG. 5A, high-power capacitor layers 55a and 55b are formed by firing. Each of the capacitor layers 55a and 55b employed in the present embodiment includes a ferroelectric layer 56a and 56b having a size approximately identical to a desired LTCC substrate, and first electrodes 57a and 57b and second electrodes 58a and 58b formed on at least a portion of one of a top surface and a bottom surface of the capacitor layer 55a and 55b.

As described above, the capacitor layers are manufactured primarily by high temperature firing. Alternatively, only the high temperature firing may be limited to be applied to the ferroelectric layers 56a and 56b.

As in the present embodiment, each of the capacitor layers 55a and 55b may further include a conductive via hole 53a extending through a portion of the ferroelectric layers 56a and 56b, to connect one of the conductive pattern and conductive via hole of the green sheets, respectively, to each other. The conductive via hole 53a serves an inter-layer circuit of the LTCC substrate. The conductive via hole 53a may cause considerable parasitic inductance unlike the via hole extending through the low dielectric LTCC substrate.

To prevent this problem, each of the ferroelectric layers 56a and 56b may have a low dielectric area 54 for surrounding the conductive via holes 53a and 53b. The low dielectric area 54 is formed of a material having a lower dielectric constant than other areas of the capacitor layer. The low dielectric area 54 may be formed of a material identical to a low temperature co-fired ceramic material forming the LTCC substrate.

Then, as shown in FIG. 5B, a plurality of low temperature co-fired green sheets 51a to 51e each having at least one of a conductive pattern 52 and a conductive via hole 53 thereon are provided. Also, the capacitor layers 55a and 55b are arranged at a desired position to provide deposition.

The low temperature co-fired green sheets 51a to 51e may be formed of an adequate mixture of $Al_2O_3$ and glass. The conductive patterns 52 and the conductive via holes 53 are formed on the low temperature co-fired green sheets 51a to 51e, respectively to serve as a necessary inter-layer circuit. The conductive patterns 52 and the conductive via holes 53 are formed of a low temperature firing electrode material such as Ag, Cu and alloys thereof. This process may be conducted by a known art such as printing and punching.

Moreover, as described above, this process may be performed while the first electrodes 57a and 57b and second electrodes 58a and 58b of the capacitor layers 55a and 55b, respectively, are printed using a low temperature firing electrode material. Since the low dielectric area 54 and the conductive via holes 53a satisfy low temperature co-firing conditions, only printing and filling are performed in this process but firing is performed in a later process as shown in FIG. 5D.

Thereafter, as shown in FIG. 5C, the capacitor layers 55a and 55b arranged at a desired location and the low temperature co-fired green sheets 51a to 51d are compressed to form an LTCC deposition 51.

In this process, the first electrodes 57a and 57b and second electrodes 58a and 58b of the capacitor layers 55a and 55b, respectively, are connected to one of conductive via holes and conductive patterns 53 of a specific one of the sheets 51b, 51c 51d and 51e to connect to the inter-layer circuit. In this case, a connecting portion is left unfired since it is formed of a low temperature electrode material such as Ag, Cu and alloys thereof. The connecting portion may be melted and integrated in a following firing process.

According to the present embodiment, the ferroelectric layers 56a and 56b of the capacitor layers 55a and 55b, which are formed of a pre-fired ceramic, are interposed between layers in the deposition 51 and serve to prevent the deposition 51 from shrinking in a planar direction. Such a shrinkage prevention effect is increased with increase in the number of the capacitor layers 55a and 55b. Therefore, compared with the embodiment shown in FIG. 3, there is little need for forming an additional confinement layer. Nonetheless, the additional confinement layer may be formed on at least one surface of the deposition to effectively prevent the deposition from contracting in a planar direction and experiencing deformation. Here, the confinement layer may be formed of a mixture of a high temperature fired ceramic powder such as $Al_2O_3$ and glass.

Finally, the LTCC deposition 51 is fired to produce an embedded LTCC substrate 50 as shown in FIG. 5D. As described above, in a case where the first electrodes 57a and 57b and second electrodes 58a and 58b of the capacitor layers 55a and 55b, the via holes 53a and the low dielectric area 54 remain unfired, they may be fired together in this process.

In this firing, the LTCC deposition 51 is effectively restrained from contracting in a planar direction due to the capacitor layers 55a and 55b, thereby prevented from cracks and deformation. On the other hand, the LTCC deposition 51 is significantly reduced in its thickness from t1 to t2.

Unlike the present embodiment, a plurality of the capacitor layers may be arranged to overlap with one another. Also, it will be easily understood that the capacitor layers may be disposed at different locations such as a top and a bottom. Moreover, in a case where the capacitor layers are located adjacent to one of a top surface and a bottom surface of the LTCC deposition, the capacitor layers themselves serve to restrain the LTCC deposition from contracting in a planar direction, similarly to the function of the confinement layer.

Therefore to assure more economic and effective anti-contraction effects, the capacitor layer may be provided on one of the top surface and bottom surface of the LTCC deposition.

Figure 6:
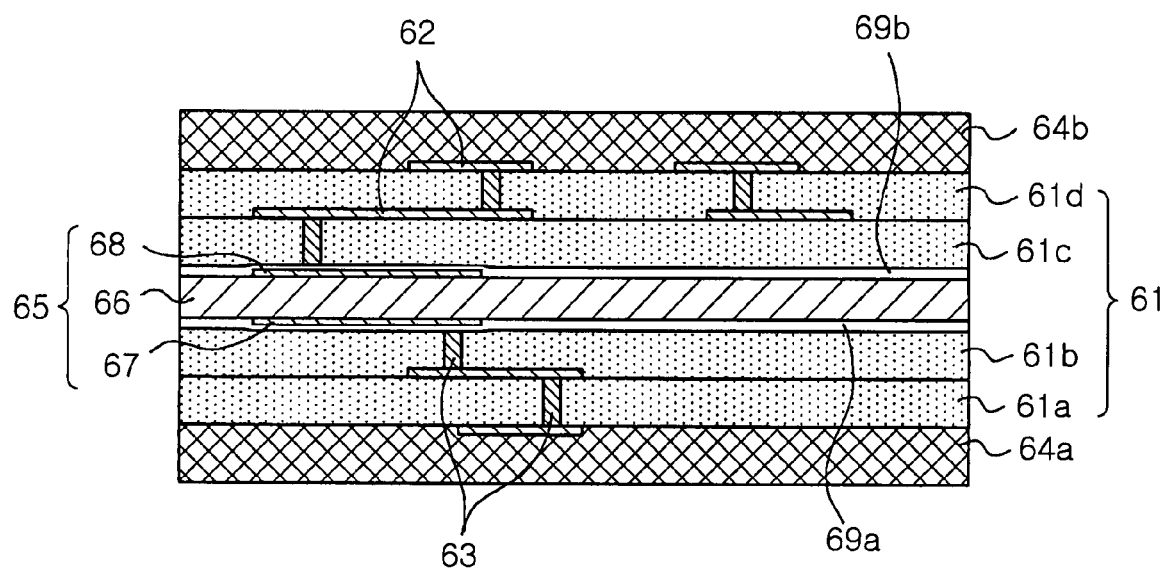
FIG. 6 is a cross-sectional view illustrating a method of manufacturing a capacitor-embedded LTCC using a binder layer according to an exemplary embodiment of the invention.

FIG. 6 is a cross-sectional view illustrating a method of manufacturing a capacitor-embedded LTCC substrate using a binder layer.

As shown in FIG. 6, in forming an LTCC deposition 61, confinement layers 64a and 64b may be compressed onto top and bottom surfaces of the deposition 61, respectively. Also, binder layers 69a and 69b may be disposed on top and bottom surfaces of a pre-fired ferroelectric layer 66, interposing a capacitor layer 65 having first and second electrodes 67 and 68 formed thereon and adjacent low temperature fired ceramic sheets 61b and 61c. These binder layers 69a and 69b ensure higher bonding strength.

The deposition 61 may be formed as shown in the deposition formation process of FIG. 5C, without employing the binder layers 69 and 69b, but requires sufficient pressure to be applied. However, excessive pressure may cause cracks or damage, or misalign the capacitor layer 65, resulting in defective connection.

Therefore, as shown in FIG. 6, to ensure inter-layer bonding with less pressure, it is beneficial to adopt the binder layers 69a and 69b. A material for the binder layers 69a and 69b may be a thermoplastic polymer such as Polyvinyl Butyral (PVB) and acrylic polymer. In this case, after the deposition is formed at a room temperature, the binder layers 69a and 69b are heat-treated at a temperature of about 60 to 100° C. to activate the thermoplastic polymer material at an interface. This accordingly ensures higher bonding strength even under a low pressure.

The thermoplastic polymer material for the binder layers 69a and 69b is diffused to a surface of an adjacent layer in a degreasing process, decomposed and thinned, and then completely eliminated during firing. This allows the pre-fired capacitor layer 65 to be chemically bonded to an interface of the adjacent low temperature co-fired ceramic layers 61b and 61c without hampering circuit connection of electrodes and conductive via holes.

As set forth above, according to exemplary embodiments of the invention, it is commercially viable to effectively embed various types of high-power capacitors on an LTCC substrate. This accordingly produces a superior and high-performing capacitor-embedded LTCC substrate having low-loss high-frequency characteristics. The capacitors embedded in the LTCC substrate noticeably reduces surface mount technology (SMT) processes in the LTCC substrate, and resultantly diminishes defects that may occur during an SMT mounting process.

In addition, when the high-power capacitors are mounted, a low-temperature co-fired electrode material such as Ag and Cu in place of a typical solder material is employed to preclude a need for plating and increase bonding strength with an inter-layer circuit of a low temperature co-fired ceramic.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a capacitor-embedded low temperature co-fired ceramic substrate, the method comprising:

manufacturing a capacitor part by firing a deposition including at least one high dielectric ceramic sheet to form a capacitor part;

providing a plurality of low temperature co-fired green sheets each having at least one of a conductive pattern and a conductive via hole thereon;

forming a low temperature co-fired ceramic deposition by depositing the low temperature co-fired green sheets to embed the capacitor part in the low temperature co-fired ceramic deposition, the embedded capacitor part connected to the one of conductive pattern and conductive via hole of an adjacent one of the green sheets; and firing the low temperature co-fired ceramic deposition having the capacitor part embedded therein, wherein the capacitor part comprises at least one deposited capacitor block including a plurality of dielectric layers and first and second internal electrodes formed on top and bottom surfaces of the dielectric layers, respectively, and the forming the low temperature co-fired ceramic deposition comprises:

punching some of the low temperature co-fired green sheets to form at least one cavity inside the low temperature co-fired ceramic deposition;

depositing the low temperature co-fired green sheets; and mounting the deposited capacitor block on the cavity in the depositing process, and wherein the cavity has a depth greater than a depth of the deposited capacitor block mounted thereon, considering a contraction degree of the low temperature co-fired green sheets during the firing.

2. A method of manufacturing a capacitor-embedded low temperature co-fired ceramic substrate, the method comprising:

manufacturing a capacitor part by firing a deposition including at least one high dielectric ceramic sheet to form a capacitor part;

providing a plurality of low temperature co-fired green sheets each having at least one of a conductive pattern and a conductive via hole thereon;

forming a low temperature co-fired ceramic deposition by depositing the low temperature co-fired green sheets to embed the capacitor part in the low temperature co-fired ceramic deposition, the embedded capacitor part connected to the one of conductive pattern and conductive via hole of an adjacent one of the green sheets; and firing the low temperature co-fired ceramic deposition having the capacitor part embedded therein, wherein the capacitor part comprises at least one deposited capacitor block including a plurality of dielectric layers and first and second internal electrodes formed on top and bottom surfaces of the dielectric layers, respectively and the forming the low temperature co-fired ceramic deposition comprises:

punching some of the low temperature co-fired green sheets to form at least one cavity inside the low temperature co-fired ceramic deposition;

depositing the low temperature co-fired green sheets: and mounting the deposited capacitor block on the cavity in the depositing process, and wherein the forming the low temperature co-fired ceramic deposition comprises:

compressing a confinement layer onto at least one of a top surface and a bottom surface of the low temperature co-fired ceramic deposition to prevent contraction of the low temperature co-fired ceramic deposition, the method further comprising removing the confinement layer from the low temperature co-fired ceramic substrate after the firing the low temperature co-fired ceramic deposition.

3. The method of claim 2, wherein the confinement layer is provided on both surfaces of the low temperature co-fired ceramic deposition.

4. The method of claim 2, wherein the confinement layer is formed of a mixture of fired ceramic and glass.

5. The method of claim 2, wherein the forming the low temperature co-fired ceramic deposition comprises interposing an internal confinement layer between a corresponding one of the green sheets providing an opening of the cavity and the green sheet adjacent above thereto.

6. The method of claim 5, wherein the internal confinement layer has a thickness ranging from about 3 to 20 μm.

7. The method of claim 5, wherein the internal confinement layer comprises a fired ceramic layer and glass layers formed on both surfaces of thereof.

8. The method of claim 2, wherein a dielectric constant of a material forming the high dielectric ceramic sheet of the capacitor part is greater than 1000.

9. The method of claim 8, wherein each layer of the low temperature co-fired ceramic substrate comprises $Al_2O_3$.

10. The method of claim 2, wherein the high dielectric ceramic sheet of the capacitor part is fired at a temperature of about 1000 to 1400° C., and
the low temperature co-fired ceramic deposition is fired at a temperature of about 900 to 1100° C.

11. A method of manufacturing a capacitor-embedded low temperature co-fired ceramic substrate, the method comprising:
manufacturing a capacitor part by firing a deposition including at least one high dielectric ceramic sheet to form a capacitor part;
providing a plurality of low temperature co-fired green sheets each having at least one of a conductive pattern and a conductive via hole thereon;
forming a low temperature co-fired ceramic deposition by depositing the low temperature co-fired green sheets to embed the capacitor part in the low temperature co-fired ceramic deposition the embedded capacitor part connected to the one of conductive pattern and conductive via hole of an adjacent one of the green sheets; and
firing the low temperature co-fired ceramic deposition having the capacitor part embedded therein,
wherein the capacitor part is at least one capacitor layer including a ferroelectric layer having a size approximately identical to a size of the low temperature co-fired ceramic substrate and the first and second electrodes formed on at least a portion of one of a top surface and a bottom surface of the ferroelectric layer, and
the forming the low temperature co-fired ceramic deposition comprises depositing the low temperature co-fired green sheets together with the capacitor layer.

12. The method of claim 11, wherein the forming the low temperature co-fired ceramic deposition comprises compressing a confinement layer onto at least one of a top surface and a bottom surface of the low temperature co-fired ceramic deposition to prevent contraction of the low temperature co-fired green sheets,
the method further comprising removing the confinement layer from the low temperature co-fired ceramic substrate after the firing the low temperature co-fired ceramic deposition.

13. The method of claim 12, wherein the confinement layer is provided on both surfaces of the low temperature co-fired ceramic deposition.

14. The method of claim 12, wherein the capacitor layer is disposed adjacent to one of the top surface and bottom surface of the low temperature co-fired ceramic deposition and the confinement layer is provided on another corresponding one of the top surface and bottom surface of the low temperature co-fired ceramic deposition.

15. The method of claim 12, wherein the confinement layer is formed of a mixture of fired ceramic and glass.

16. The method of claim 11, wherein the capacitor layer further comprises a conductive via hole extending through a portion of the ferroelectric layer where the first and second electrodes are not formed, to connect one of the conductive pattern and conductive via hole of the green sheets disposed on a top and a bottom of the capacitor layer, respectively, to each other.

17. The method of claim 16, wherein the capacitor layer has a low dielectric area for surrounding the conductive via hole in the dielectric layer, the low dielectric area formed of a material having a dielectric constant lower than other areas of the capacitor layer.

18. The method of claim 17, wherein the low dielectric area is formed of a material identical to the low temperature co-fired ceramic material forming the low temperature co-fired ceramic substrate.

19. The method of claim 11, wherein the forming the low temperature co-fired ceramic deposition comprises:
depositing the plurality of low temperature co-fired green sheets to interpose a binder layer between the capacitor layer and an adjacent one of the low temperature co-fired green sheets, thereby increasing binding strength therebetween.

20. The method of claim 19, wherein the binder layer is formed of a thermoplastic polymer material removable during firing of the low temperature co-fired ceramic deposition.

21. The method of claim 20, wherein the forming the low temperature co-fired ceramic deposition comprises heat-treating the binder layer interposed between the capacitor layer and the adjacent cold temperature co-fired green sheet at a temperature of 60 to 100° C. to activate the thermoplastic polymer material.

* * * * *